United States Patent [19]

Ranganath

[11] Patent Number: 5,239,591
[45] Date of Patent: Aug. 24, 1993

[54] CONTOUR EXTRACTION IN MULTI-PHASE, MULTI-SLICE CARDIAC MRI STUDIES BY PROPAGATION OF SEED CONTOURS BETWEEN IMAGES

[75] Inventor: Surendra Ranganath, Peekskill, N.Y.
[73] Assignee: U.S. Philips Corp., New York, N.Y.
[21] Appl. No.: 725,144
[22] Filed: Jul. 3, 1991
[51] Int. Cl.$^5$ .................. G06K 9/48; G06K 9/20; G06K 9/54; A61B 5/05
[52] U.S. Cl. ........................................ 382/6; 382/22; 382/48; 382/49; 395/142; 395/924; 128/653.2
[58] Field of Search .................. 382/6, 22, 19, 27, 48, 382/49, 9, 60; 395/141, 142, 924, 119; 128/653.1, 653.2; 324/309, 307

[56] References Cited

U.S. PATENT DOCUMENTS

| | | | |
|---|---|---|---|
| 4,710,717 | 12/1987 | Pelc et al. | 324/309 |
| 4,876,509 | 10/1989 | Perlmutter | 324/309 |
| 4,903,704 | 2/1990 | Van Eggermond et al. | 128/653 |
| 4,958,637 | 9/1990 | Aritomi | 128/653 |
| 4,982,328 | 1/1991 | Kasugai | 324/309 |
| 5,093,870 | 3/1992 | Watanabe | 382/47 |

OTHER PUBLICATIONS

"Shape-based Interpolation", Gabor T. Herman et al., University of Pennsylvania May 1992, pp. 69-79.
"Shape-Based Interpolation of Multidimensional Objects" Sai Prasad Raya et al. IEEE Transactions on Medical Imaging vol. 9, No. 1, Mar. 1990, pp. 32-42.
Philips Medical Systems, Operators Manual, Cardiac Package, Release 4.7 (1988).
Yachida et al., "A Plan Guided Analysis of Cineangiograms for Measurement of Dynamic. . . " IEEE Transactions on Pattern Analysis and Machine INte. vol. PAMI-2 No. 6.
Rang et al. "Model Guided Automatic Frame-to-Frame Segmentation in Digital Segmentation . . . " Science and Engineering of Medical Imaging Apr. 24-26, 1989 Paris, France.
Lin et al., "Dynamic Elastic Interpolation for 3-D medical Image Reconstruction from Serial Cross Sections" IEEE Transactions on Medical Imaging vol. 7, No. 3 Sep. 1988.
"A Computational Approach to Edge Detection" IEEE Transactions on Pattern Analysis and Machine Intelligence, vol. PAMI-8 No. 6, Nov. 1986 by John Canny.
"Snakes: Active Contour Models": International Jor. of Computer Vision 321-331 (1988) by Kass et al.
"Using Dynamic Programming for Minimizing the Energy of Active Contours in the Presence of Hard Constraints" 1988 IEEE by Amini et al.
"ECG-Synchronized Cardiac MR Imaging: Method and Evaluation" Radiology Jun. 1985 vol. 155 No. 3 by Lanzer et al.

Primary Examiner—David K. Moore
Assistant Examiner—Michael Cammarata
Attorney, Agent, or Firm—Jack D. Slobod

[57] ABSTRACT

Contours are extracted from corresponding features the left ventricular blood pool-endocardium interfaces, of a plurality of images collected as a multi-phase multi-slice cardiac Magnetic Resonance Imaging (MRI) study which are accessible by a computer in response to user input to the computer of a seed contour identifying the contour feature to be extracted in an initial image at a middle slice position and a predetermined phase position, namely end of diastole. From this as the only contour inputted by the user, contours are extracted from each image by a sequence of automatic propagation of determinations of extracted, or final contours by forming from a final contour for an image, a seed contour for a not yet processed image which immediately adjoins in slice or phase position. For each image use is made of a seed-to-final propagation function in the form of an energy minimizing active contour function which has internal energy due to settable resistances to stretching and bending and image derived energy related to the gradient of the image. The final contour developed in the initial image is passed as a provisional contour to images which immediately adjoin in phase position where they are further propagated by an in-phase provisional-to-seed propagation function and are passed to images which immediately adjoin in slice position, where they are further propagated by an in-slice provisional-to-seed propagation function. After extraction of the contours, and possible automatic post-processing for correction thereof, these contours are used by a computational or visualization application, such as the computation of an ejection fraction.

16 Claims, 7 Drawing Sheets

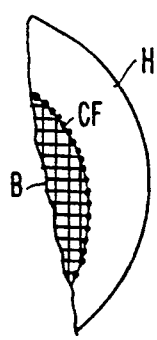
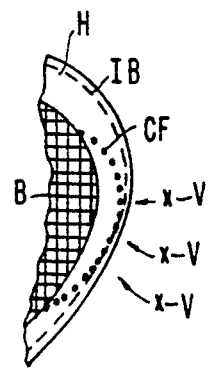
FIG. 8A    FIG. 8B
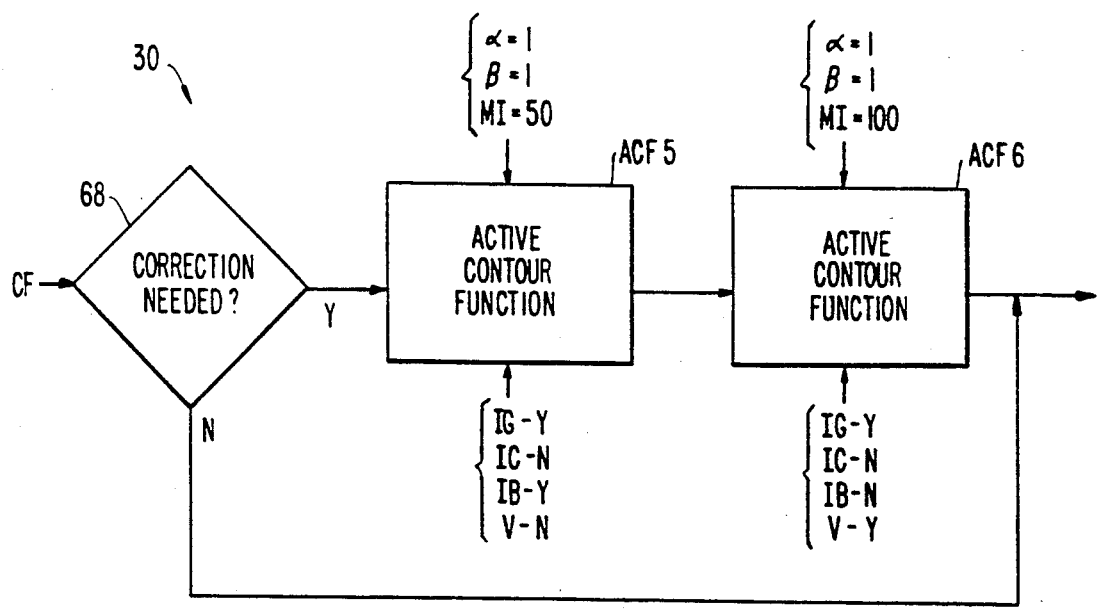
FIG. 8C

CONTOUR EXTRACTION IN MULTI-PHASE, MULTI-SLICE CARDIAC MRI STUDIES BY PROPAGATION OF SEED CONTOURS BETWEEN IMAGES

BACKGROUND OF THE INVENTION

1. Field of The Invention

The present invention is generally directed to a method of extracting corresponding feature descriptive contours from a collection of images of slices of an object undergoing a repetitive motion cycle in response to an input of a seed contour proximate a feature contour in an image at given slice and motion cycle phase positions. In its more particular aspects, the present invention is directed to extracting such corresponding feature contours from magnetic resonance imaging (MRI) multi-image studies of the beating heart by automatic propagation of seed contours between images of different slices and/or between images of different phases.

2. Description of the Prior Art

MRI has become an invaluable medical diagnostic tool because of its ability to obtain high resolution in vivo images of a selected portion of the body, without invasion or use of ionizing radiation. In such imaging, a main magnetic field is applied longitudinally to an elongated generally cylindrical measurement space. The strength of this field determines the Larmor frequency of the relevant atomic nuclei (e.g. Hydrogen protons) to be excited. Sequences of radio frequency (rf) pulses, at or near this Larmor frequency, and magnetic field gradients are applied to the measurement space and resultant spin resonance signals, such as echo signals, are sampled. The collection of MR signal samples obtained from plural sequences applicable to the same slice are transformed in a processing unit, typically by Fourier transformation, to a two-dimensional array of pixel intensities which may be displayed on a display device or printed (typically to a film) as an image of the slice. It is common in MRI studies to make contemporaneous collections of MR signal data for plural images of the same body portion, such as parallel slices.

An interesting aspect of this imaging modality is that the image produced is not merely of the density of the relevant nuclei, but molecule type and/or motion dependent contrasts may be weighted as a function of the type and echo time of sequences utilized. For example, due to blood motion a spin-echo type sequence produces a "black blood" image because the relevant nuclei of the blood passing through the slice are not influenced by both excitation and echo rf pulses, while a small excitation angle fast gradient echo sequence produces a "white blood" image because the relevant nuclei of blood passing through the slice has not been depopulated of longitudinal magnetization spin states by prior excitation pulses.

The various configurations of the heart in its cycle of dilation and contraction are referred to as phases; these include the extremes of end of diastole and end of systole. Synchronizing information obtained from an electrocardiogram (ECG) is used either to trigger the evolution of the sequences for the desired phase(s) as in commonly owned U.S. Pat. No. 4,903,704 or as a means for sorting of MR signal samples obtained in a free running fashion as in U.S. Pat. No. 4,710,777. The image quality obtained varies dependent upon such conditions as echo time, phase position in the cardiac cycle and anotomic level of slice position, see P. Lanzer et al, "ECG-Synchronized Cardiac MR Imaging: Method and Evaluation", Radiology, Vol. 155, No. 2, June 1985, pp. 681–686.

Images for up to sixteen different phases are collectible with a cardiac package of Philips Medical Systems (Release 4.7, February 1988). After data for plural images representing multiple slices and multiple phases thereof are collected and supplied to an imaging workstation, the phases for a slice may be there displayed sequentially as a movie. Such movies for different slices may be displayed in side-by-side fashion.

Contour feature extraction from the cardiac image may be used for computational purposes such as computing a measure of the volume of the blood pool in a ventricle when the extracted contour is the inner heart wall (endocardium). An ejection fraction may then be computed from such ventricular volume measures of the end of diastole and end of systole phase positions.

In the aforementioned currently available package, the user "draws" on the image displayed by the workstation an outline of the edges of the cardiac chamber or wall of interest, a so-called irregular region of interest (IROI) by means of an input device, such as a trackball, redrawing as necessary until the user is satisfied that the contour drawn sufficiently matches the image contour feature of interest. Furthermore, IROI's may be stored in a data base for potential use with differently weighted images of the same phase and slice. Alternatively, the workstation may use a roughly drawn contour input by the user as a guide to an edge detection procedure which searches for an edge-detected contour near the rough contour. The contour produced by edge detection generally suffers from gaps, discontinuities in position or slope, multiplicities or other deficiencies which require editing or redrawing by the user. Because of these deficiencies and the differences between images at successive slice or phase positions, the contour produced by edge detection cannot serve as a rough contour for an adjoining slide or phase position without at least its prior review, and more generally, its modification, by the user.

An energy minimizing active contour function termed a "snake" has been proposed in M. Kass et al, "Snakes: Active Contour Models", International Journal of Computer Vision (1988), pp. 321–331, as a means for locking on to local features such as edges, and contours in an image and once locked on, tracking them in motion or matching them in stereopsis. An energy function is considered made up of the weighted sum of internal energy terms due to resistances to stretching and bending, image energy terms dependent on the type of feature the snake is to find, and external constraint energy terms, due to forces from such well behaved constructs as "springs" and point sources termed "volcanoes". The weighting of the resistances to stretching and bending indicate the degree to which the snake assumes a spatially smoothed contour. The "snake" active contour was further generalized in A. Amini et al, "Using Dynamic Programming for Minimizing the Energy of Active Contours in the Presence of Hard Constraints", Second International Conference on Computer Vision (Dec. 1988) pp. 95–99 to a dynamic programming in which the constraints imposed do not have to be spatially differentiable forces.

SUMMARY OF THE INVENTION

It is an object of the present invention to provide for contour extraction in multi-phase multi-slice image data, as from MRI cardiac studies, using an active contour model function in which the user need only draw a seed contour in one phase of one slice in order to extract corresponding contours from all phases and slices. It is a related object to provide a method for forming a seed contour for an image from the final contour generated for an adjoining phase or slice.

These objects are satisfied by choosing a first slice position which preferably corresponds to a "middle" slice, spatially, and a first phase position which, for MRI cardiac studies, preferably corresponds to the end of diastole, in phase. Then, with respect to an initial image at the first slice and phase positions, the user draws, by means of an input device, a seed (or rough) contour in the vicinity of the contour feature to be extracted. This seed contour is propagated to a final contour, fitting the desired true contour of the initial image, by means of a seed-to-final propagation function which comprises a series of iterations using a "snake" active contour model function utilizing an image energy term which is intensity gradient dependent. The resultant final contour for the initial image is propagated to the other images in the first phase position along an in-phase path directed from the initial image, in opposite directions successively by slice position. In this in-phase propagation between slices, the final contour of the initial image is a provisional contour for the two in-phase images of the slices immediately preceding and immediately succeeding the first image in slice position.

These provisional contours are propagated to seed contours for these two in-phase images by means of an in-phase provisional-to-seed propagation function. Then, as with the first image, the resultant seed contours are propagated to final contours for the two images by the seed-to-final propagation function. Such propagation continues to the other images in the first phase position, successively, by alternate application of the in-phase provisional-to-seed and the seed-to-final propagation functions, until final contours are generated in each image in the first phase position.

The final contours generated in the plurality of images in the first phase position (including the initial image) are further propagated in respective in-slice paths directed from the respective images in the first phase position, in opposite directions by phase position. In each in-slice path there is repeated alternate application of an in-slice provisional-to-seed propagation function and the seed-to-final propagation function until final contours have been generated in each image.

A further feature of the invention is that the in-phase provisional-to-seed propagation function comprises application of a correspondence matching procedure followed by application of a smoothing procedure using a limited number of iterations of the "snake" active contour function in the absence of image or constraint energy terms, while the in-slice provisional-to-seed propagation function comprises two sequential applications of the "snake" active contour function, both with internal energy parameters set to stiffen the "snake". The first application of the "snake" active contour function is in the presence of an image gradient term and, where needed, an image derived constraint term in the form of repelling bands, termed a barrier, including an operative portion proximate the outer heart wall (epicardium). In the second application of the "snake" active contour function, an image derived constraint term in the form of an attractive band, termed a "Canny edges", including an operative portion proximate the inner heart wall (endocardium).

Another feature of the invention is that, in order to simplify computation, the same barrier is used for all phases of any slice which because of apparent relative thinness of the heart wall, requires a barrier. Such a barrier is also used in application of the contour function for seed-to-final contour propagation.

BRIEF DESCRIPTION OF THE DRAWING

Other objects, features and advantages of the invention will become apparent upon perusal of the following detailed description of the preferred embodiment when taken in conjunction with the appended drawing, wherein:

FIGS. 8A and 8B are pictorial representations of respectively correctly and incorrectly determined final contours for illustrating the underlying procedure employed in a post-processing block in FIG. 2; and FIG. 8C is a flowchart detailing the post processing block in FIG. 2.

DETAILED DESCRIPTION OF THE PREFERRED EMBODIMENTS

The method of the present invention is directed in general to extracting a contour feature in a collection of images of slices of an object undergoing a repetitive motion cycle, by the steps of using an extracted contour for an image at a given slice position and given phase position in the motion cycle for automatically determining seed contours for an image at an adjoining slice or phase, which seed contour is used to automatically determine an extracted contour. The repeated application of these steps according to a propagation sequence allows for the determination of extracted contours from all images in the collection based on providing a user-input seed contour for only one of the images. This method is particularly useful for extracting a contour feature such as an inner wall of a ventricle from multi-slice multi-phase MRI data.

Figure 1:
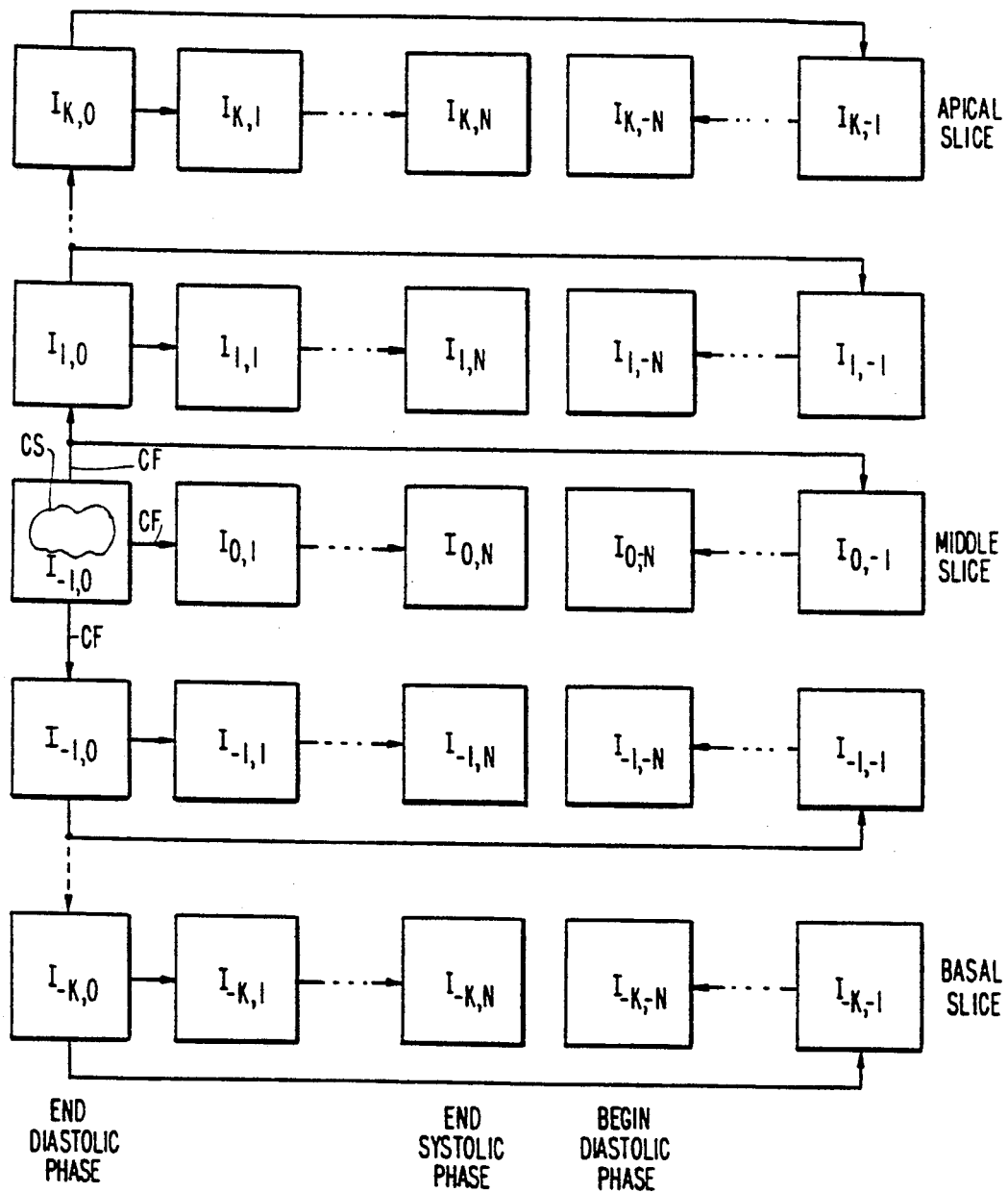
FIG. 1 is a pictorial representation of a multi-slice multi-phase collection of images illustrating the paths of contour propagation.

Referring first to FIG. 1 of the drawing, there is illustrated such a multi-slice multi-phase cardiac MRI study comprised by a collection of bins of image data, I, each bin containing data for a rectangular grid of pixels for an associated image at a different combination of slice position and phase position in the beating cycle. Each bin of image data is accessible to data processing apparatus, preferably of the workstation type (not shown), and the associated image displaceable on a display portion thereof. For purpose of illustration of the sequence of propagation of determinations by the data processing apparatus of extracted contours, the bins are shown arranged in a two dimensional array to indicate by the bin's vertical and horizontal locations in the array, the position of the associated image, I, respectively, as to slice and phase. More specifically, the image data bins are ordered vertically in a series of consecutive parallel positions of slices from basal to apical and horizontally in consecutive phase positions, beginning through ending the diastolic phase and the systolic phase. A typical collection may comprise six slice positions and ten phase positions.

In accordance with the present invention, an initial one of the images $I_{0,0}$ corresponding to an image data bin at a predetermined slice and phase position is displayed and the desired contour feature is identified by the user "drawing" a seed contour CS along the desired contour by input to the data processing apparatus via a suitable curve input device such as a trackball, mouse, light pen, digitizing tablet, or "touch" sensitive display overlay. The predetermined initial slice position is preferably a "middle" slice in the series, for substantially symmetric propagation between slices. Where the number of slice positions is even, "middle" includes either of the two slices on opposite sides of the middle of the series. Further, the initial phase position is preferably the end of diastole because such images have been found to have less artifacts. As shown further in FIG. 1, the path of determinations of extracted or final contours CF proceeds in opposite directions (vertically) from the initial image, slice by slice in the initial phase position, and in opposite directions (horizontally) from each slice in the initial phase position, phase by phase in the same slice position. In each current image after the initial image, the final contour propagated from a previous image to a current image is first propagated to a seed contour for the current image, which seed contour is used in the same manner as in the initial image to produce a final contour for the current image.

Figure 2:
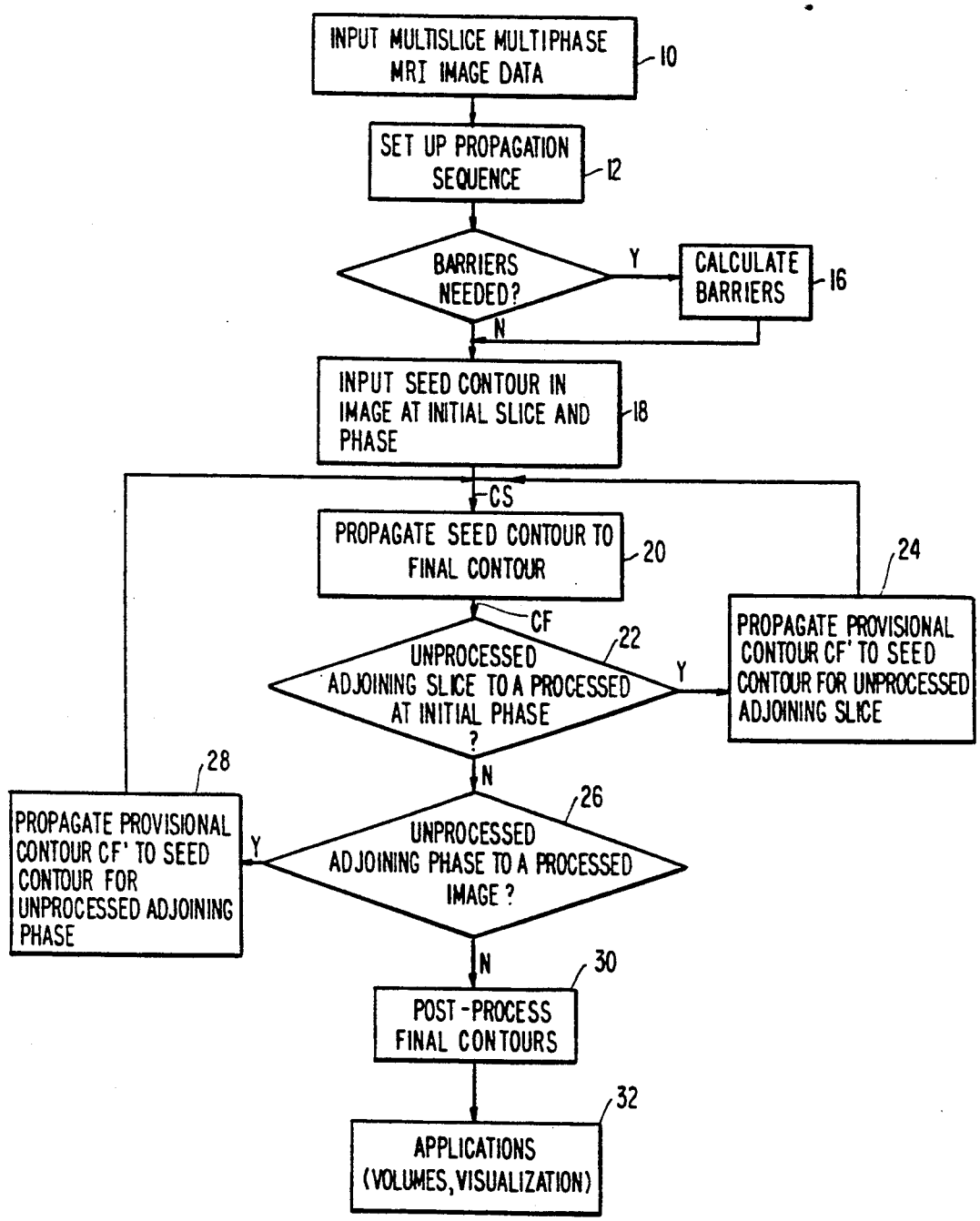
FIG. 2 is a flowchart overview of the contour extraction method of the present invention, including blocks which perform the contour propagations in the paths of FIG. 1.

With this background, the overview of the inventive method indicated by FIG. 2 will now be discussed. In the initial step indicated by block 10, the multi-slice multi-phase MRI data collected by MRI scanning of a patient, is input to a memory or mass storage device (not shown) accessible to the computer. Then, in block 12, the bins of image data are ordered as to slice and phase position, which sets up the propagation sequence indicated in FIG. 1. Next, it is determined in block 14 whether based on the nature of the MRI study (barriers are needed for gradient-echo but not spin-echo studies) any barriers are needed in slice positions where the heart wall has at least a portion of apparent reduced thickness, as is typical in apical slices. As will become clearer as the discussion proceeds, a barrier is a collection of bands of image energy along edges of a thresholded image, which energy is opposite in sign to the energy due to the gradient of the image at the contour feature to be extracted. An operative band of the barrier is to be positioned proximate the heart wall opposite the contour feature to be extracted in order to repel an active contour away from the opposite wall. In the exemplary case where the desired contour feature is the inner wall of a heart chamber, such as a ventricle, in order to define the outer boundary of the blood pool in the ventricle, the barrier is to be positioned substantially along the outer wall of the ventricle. Preferably, the data processing apparatus automatically schedules a barrier calculation 16 for each slice, when the MRI image data was produced by a gradient echo sequence, in view of artifacts common in such a sequence.

Thereafter, in block 18, as heretofore described, a seed contour CS is input by the user proximate the contour feature to be extracted in the initial image. This seed contour CS is in block 20 propagated to a final contour CF utilizing a "snake" active contour model as the seed-to-final propagation function. This active contour model and its application to seed-to-final propagation will be further discussed in conjunction with Figures 3A and 3B.

The final contour CF resulting from this processing of the initial image $I_{0,0}$ (FIG. 1) is passed to a first pair of images $I_{1,0}$ and $I_{-1,0}$ at the initial phase position which respectively immediately succeed and immediately precede the initial image in slice position. This is accomplished as a result of identifying in block 22 unprocessed images at the initial phase position which immediately adjoin an already processed image in slice position, and consequently taking a "yes output branch from block 22. The passed final contour, is considered a provisional contour CF' in each of the first pair of images. Provisional contour CF', is for each image of this pair propagated by block 24 to a seed contour. Block 24 performs an in-phase provisional-to-seed propagation function which will be more fully detailed in conjunction with discussion of FIGS. 5 and 6A–6C. The seed contours CS developed in block 24 are propagated in block 20 to final contours CF for the first pair of images $I_{1,0}$ and $I_{-1,0}$. These final contours CF are passed, as a result of again taking the "yes" output branch of block 22, to image $I_{2,0}$, immediately succeeding image $I_{1,0}$ and to image $I_{-2,0}$, immediately preceding image $I_{-1,0}$ in slice position. In the same manner, propagation continues through the loop comprising blocks 20, 22 ("yes" output branch) and 24 until the entire sequence of determinations of the final contours CF in each of the images in the initial phase position has been accomplished. When the last pair of images, $I_{K,0}$ and $I_{-K,0}$ have been processed, the "no" output branch of block 22 is taken to block 26.

In block 26, unprocessed images are identified which adjoin a processed image in phase position. Each identification of such an adjoining unprocessed image results in taking a "yes" output branch from block 26 and the passing of the final contour CF from the processed image to the adjoining unprocessed image where it is considered a provisional contour CF'. This provisional contour CF' is propagated to a seed contour CS in block 28 by an in-slice provisional-to-seed propagation function which will be further detailed in conjunction with the discussion of FIG. 7. The seed contour CS output from block 28 is propagated to a final contour CF for the previously unprocessed image. As should now be apparent, a loop comprising blocks 20, 22 ("no" output branch), 26 ("yes" output branch) and 28 produce a separate path of in-slice propagation of determinations of final contours CF in opposite phase directions from each image in the initial phase position. For example, the in-slice propagation from the initial image $I_{0,0}$ begins with identification in block 26 of a third pair of images $I_{0,1}$ and $I_{0,-1}$ immediately succeeding and immediately preceding the initial image in phase position. As a consequence, the final contour CF from initial image $I_{0,0}$ (in addition to being passed to the first pair of images $I_{1,0}$ and $I_{-1,0}$ for in-phase propagation) is passed to third pair of images $I_{0,1}$ and $I_{0,-1}$ as a provisional contour CF' which is propagated in block 28 individually for each of images $I_{0,1}$ and $I_{0,-1}$ to respective seed contours CS.

When all images have been processed, the "no" output branch of block 26 is taken to block 30, for the purpose of performing any necessary correction of a final contour CF, as will be further discussed in conjunction with FIG. 8, in order to produce a set of extracted contours CE. Such correction is considered only when the MRI data is from a gradient-echo study. Lastly, the extracted contours CE are utilized in applications block 32. A typical application is the calculation of the volume of the space enclosed by a surface at a particular phase, such as the blood pool enclosed by the endocardium of the left ventricle at diastole (maximum expansion) and systole (maximum contraction). This volume is calculated according to well known numerical methods utilizing a set of sample points along the extracted contours corresponding to the surface at the particular phase and a priori knowledge of the spacing between slices. The difference between the volumes of the blood pool at diastole and systole divided by the volume thereof at diastole gives the ejection fraction. While only the extracted contours for these two phases are needed for computation of ejection fraction, the availability of extracted contours for all phases enables a dynamical graphical three-dimensional perspective rendering of heart surfaces and walls.

Figure 3A:
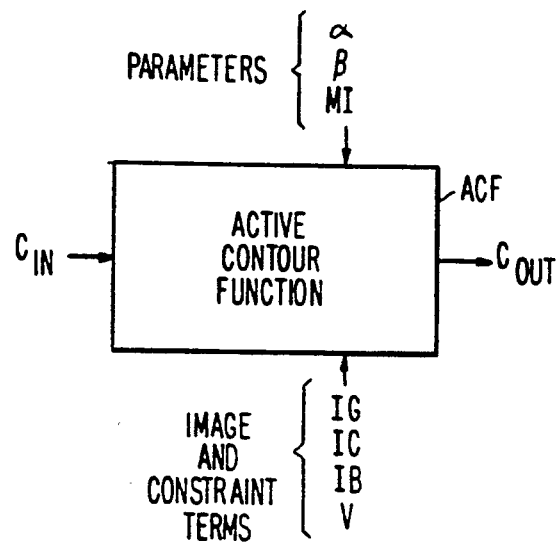
FIG. 3A is a block representation of an adaptable active contour function.

A generalized active contour function ACF in the nature of the energy minimizing "snake" proposed by M. Kass et al will now be described for propagating an input contour $C_{IN}$ to an output contour $C_{OUT}$. FIG. 3A illustrates that the generalized active contour function ACF is made adaptive by the values of various parameters and presence or absence of various image and constraint terms being settable. This allows use of function ACF in implementing contour propagation blocks 20, 24, and 28.

Some theoretical background from M. Kass et al is useful in understanding the operation of active contour function ACF. An energy functional E* for the contour is, in general:

$$E^* = \int_c E_{INT}(v(s))ds + \int_c E_{IMAGE}(v(s))ds + \int_c E_{CON}(v(s))ds$$

where:
v(s) is a vector to points x(s), y(s) on the contour,
$E_{INT}$ is internal energy,
$E_{IMAGE}$ is image energy, and
$E_{CON}$ is constraint energy.

The internal energy $E_{INT}$ due to stretching and bending of the contour is taken as:

$$E_{INT} = (E(s)|v_s(s)|^2 + \beta(s)|v_{ss}(s)|^2)/2$$

where:
(s) and $\beta$(s) are respectively resistances to stretching and to bending, generalized to vary along the contour, and
$v_s$ and $v_{ss}$ are respectively the first and second spatial derivatives of the contour.

In order to define a suitable image energy function which has local minima at edges, $E_{IMAGE}$ is chosen as the negative of the square of the intensity gradient, as follows:

$$E_{IMAGE} = -|\nabla M(v(s))|^2$$

where:
M(v(s)) is the intensity of the image at points along the contour, and
$\nabla$ is the gradient operator $2/2x\ \hat{a}_x + 2/2y\ \hat{a}_y$.

Terms making up the constraint energy $E_{CON}$ may take a variety of forms depending on the contour extraction problem posed. In the exemplary typical situation where the contour feature to be extracted is the inner wall of the ventricle, the constraints used may include a so-called "barrier" having an energy term IB in the form of a band of positive energy lying approximately along the outer heart wall to repel the contour and a so-called "Canny edge" having an energy term IC in the form of a band of negative energy lying approximately along the inner heart wall to attract the contour away from the outer heart wall. An additional constraint comprises one or more so-called "volcanos" in the form of respective point sources, each having a positive energy function V in proportion to the inverse of the distance from the point source. The latter may be clipped or otherwise limited very close to the point source. Volcanos may be placed outside the outer heart wall to repel the contour.

The above relationships may be discretized spatially by sampling the closed contour so that it is divided into N consecutive points (such as i=0 to 63) spaced apart by N−1 equal distances along the contour and dynamic parameters such as viscous friction may be added for the purpose of stabilizing the temporal evolution of the output contour in successive time steps each corresponding to an iteration number. The iterative equations can then be written in matrix form as follows:

$$x_n = (A + \Gamma I)^{-1}(x_{n-1} - f_x(x_{n-1}, y_{n-1}))$$

$$y_n = (A + \Gamma I)^{-1}(y_{n-1} - f_y(x_{n-1}, y_{n-1}))$$

where
$x_n$ and $y_n$ are column vectors of the set of consecutive points along the contour as a result of the nth iteration,
$x_{n-1}$ and $y_{n-1}$ are column vectors of the set of consecutive points along the contour as a result of the (n−1)th iteration,
A is a pentadiagonal banded matrix (plus three elements in upper right and lower left corners) containing terms which are arithmetic combinations of the coefficients $\alpha_i$ and $\beta_i$ at the various points along the contour,
I is the identity matrix,
$\Gamma$ is the friction coefficient,
$f_x$ and $f_y$ are spatial partial derivatives of $E_{IMAGE} + E_{CON}$ respectively with respect to x and y.

Such iterations may continue until a convergence is declared as a result of fluctuation of the energy function E* being small in successive iterations, or upon reaching a predetermined maximum number of iterations MI.

In the present invention, for the types of contours to be extracted from cardiac MRI studies, making $\alpha$ and $\beta$ constant over the contour yielded satisfactory results and simplifies the content of the matrix A. It is recognized however that in general the ability to assign different $\alpha$ and $\beta$ at special portions of the contour, such as those of extreme curvature, may be beneficial.

The generalized active contour function ACF will now be readily understood with reference to FIG. 3A. Therein, the values of parameters and B (where constant, or a scaling factor where not) and MI are passed to active contour function ACF as well as indications of whether the energy functional is to include the image energy term $E_{IMAGE}$ and any of three possible terms making up constraint energy $E_{CON}$. The image energy term is referred to as IG (for image gradient) and the three possible terms making up the constraint energy are IC (for image "Canny edge"), IB (for image barrier) and V (for volcano). Thus, setting the stiffness of the active contour ($\alpha$, $\beta$), the maximum number of iterations MI and the presence or absence of energy terms IG, IC, IB, and V make the active contour function ACF adaptable to various different contour processing tasks.

Figure 3B:
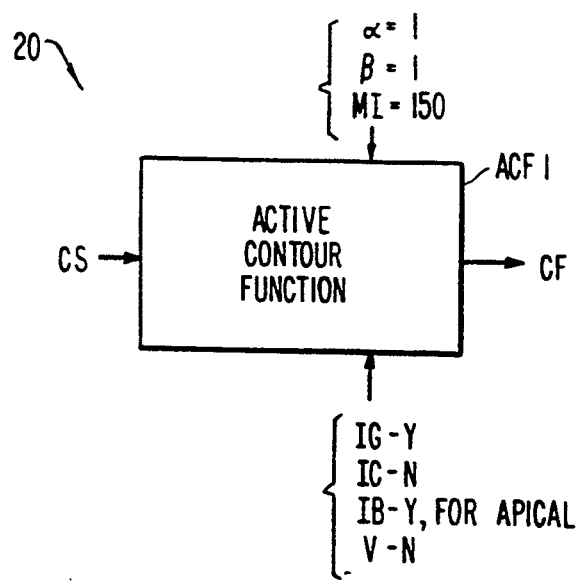
FIG. 3B is a block representation of the active contour function of FIG. 3A adapted to propagate a seed contour to a final contour, detailing a block in FIG. 2.

In FIG. 3B, block 20 for propagating a seed contour CS to a final contour CF is shown as comprising a first active contour function ACF1 with $\alpha=1$, $\beta=1$, MI=150 in the presence of image gradient IG and of barrier IB terms, the latter being only for predetermined slice(s), generally the one or two most apical slices of gradient echo cardiac MRI studies, where the heart wall appears reduced in thickness and artifacts may be present.

Figure 4:
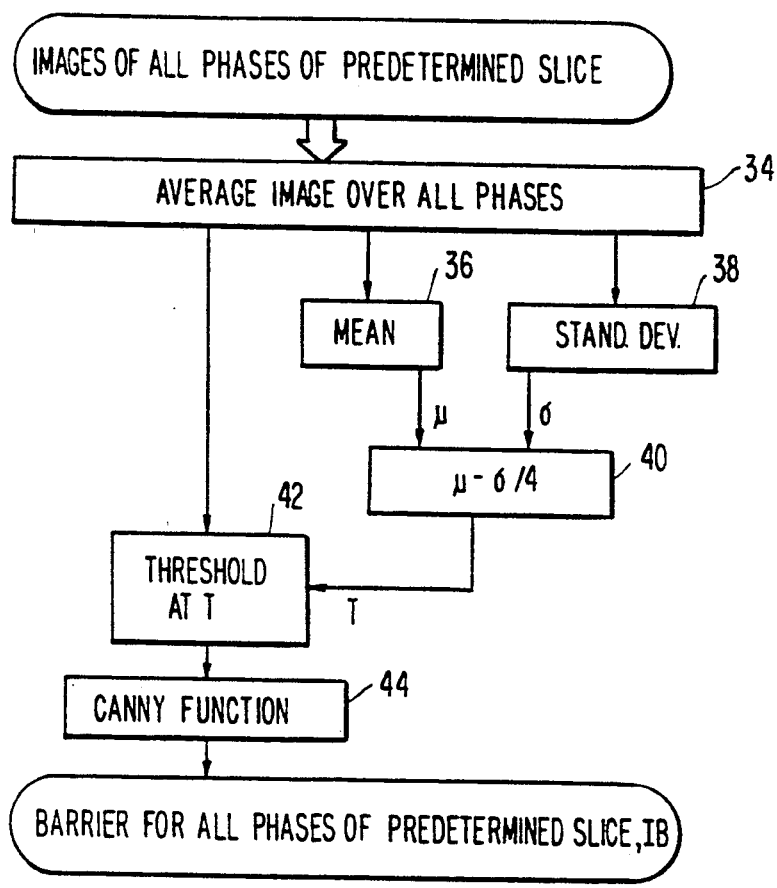
FIG. 4 is a flowchart of a barrier calculation, detailing another block in FIG. 2.

The determination of barrier energy bands for the image barrier term IB will now be discussed in conjunction with FIG. 4. It has been found that the motion of the outer heart wall of the left ventricle is sufficiently limited that the same barrier contour may be used in each phase position of the predetermined slice. Thus, the corresponding pixels of all images of the predetermined slice are averaged in block 34 to form an average image. The mean intensity $\mu$ and the standard deviation $\sigma$ of the intensity are computed respectively in boxes 36 and 38 and a threshold intensity T is formed in block 40 as $\mu - \sigma/4$. The averaged image is then threshold in block 42 at threshold T to form a binary image, i.e. white where the intensity of the average image is greater than or equal to threshold T and elsewhere black. This binary image is processed by the "Canny Function" edge detection function block 44 to extract the boundaries of the binary image.

Function block 44 detects these boundaries using a "feature synthesis" edge marking technique of J. Canny, "A Computational Approach to Edge Detection", IEEE Transactions on Pattern Analysis and Machine Intelligence, VOL. PAMI-8, No. 6, November 1986, pp. 679-698. Essentially, edges are marked according to thresholding with hysterisis, the results of convolving the thresholded image with an edge responsive filter operator or kernel such as the derivative of a Gaussian. The use of hysteris implies two different thresholds are used for marking a group of connected pixel positions such that the operator output when centered about at least one of the pixel positions of the group exceeds a higher threshold and exceeds a lower threshold when centered about each pixel position of the group. Thus connected pixels tend to be marked, and thereby extracted as the barrier.

Figure 5:
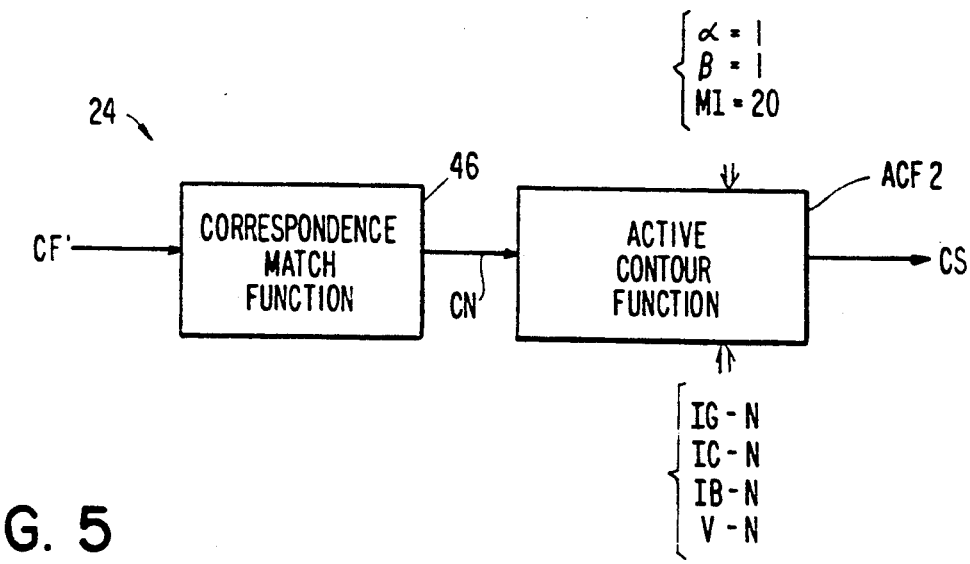
FIG. 5 is a flowchart detailing yet another block in FIG. 2, namely an in-phase propagation of a final contour in a previous image to a seed contour in a current image which is of an adjoining slice.

In-phase provisional-to-seed propagation function block 24 is detailed in FIG. 5 as comprising a correspondence match function block 46 which produces a so-called noisy contour CN which is applied to a second active contour function block ACF2 that spatially smooths contour CN. This spatial smoothing is accomplished by using a normal stiffness ($\alpha=1$, $\beta=1$), a limited number of iterations (MI=20), and turning off all image and constraint terms.

Figure 6A:
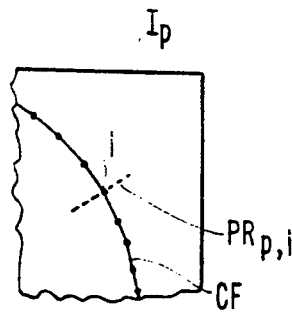
FIGS. 6A and 6B are pictorial representations of related portions respectively of previous and current images, which representations are used to illustrate the procedure employed in a correspondence match function block in FIG. 5.
Figure 6B:
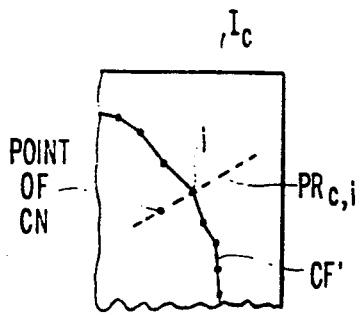
Figure 6C:
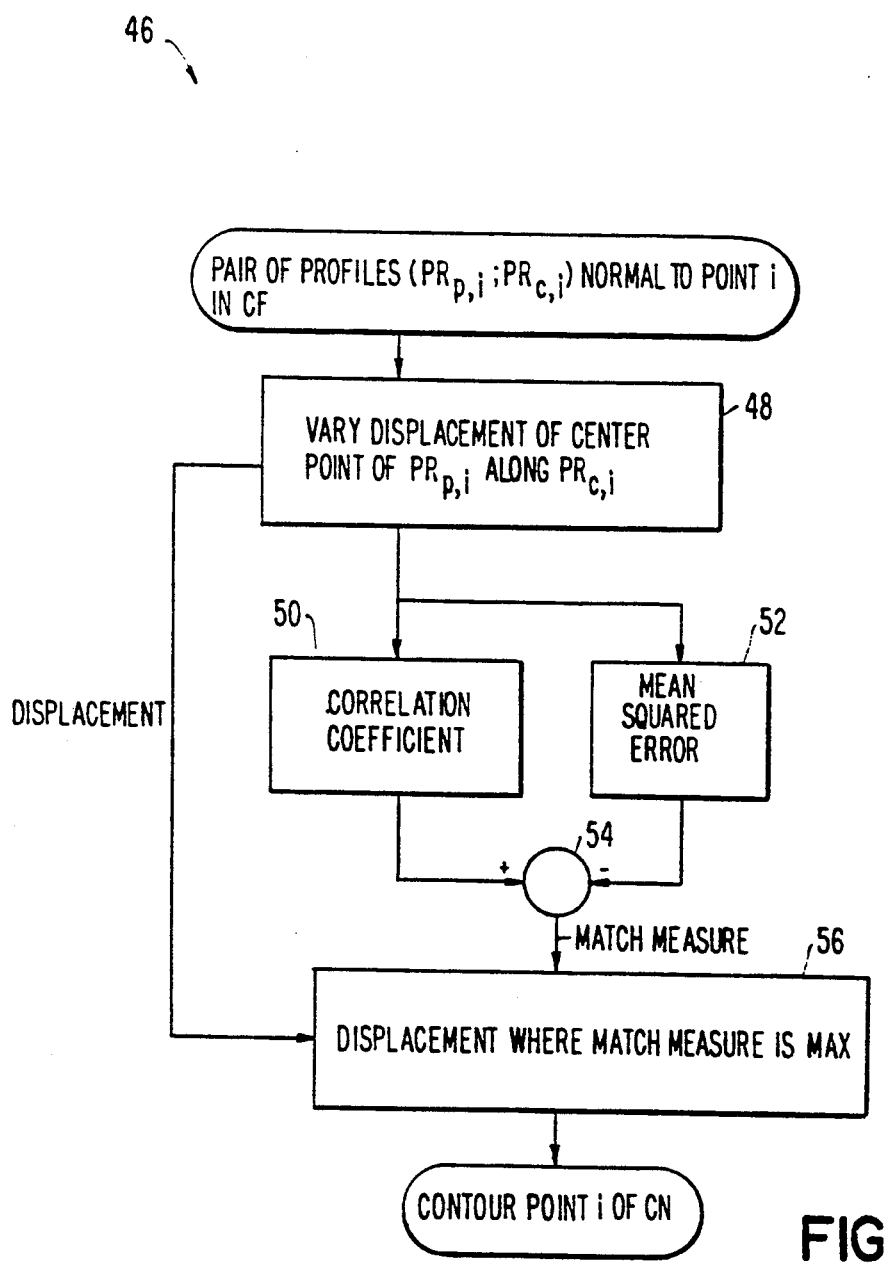
FIG. 6C is a flowchart detailing the correspondence match function block of FIG. 5.

Correspondence match function block 46 will be understood by first referring to FIGS. 6A and 6B respectively representing corresponding portions of previous and current images $I_p$ and $I_c$. At each sample point i on the final contour CF in previous image $I_p$ there is identified a line of uniformly spaced consecutive sample points interpolated from the grid of pixels, termed a profile $PR_{p,i}$, which line is centered about point i and extends normal to contour CF equally in opposite directions. The number of sample points in each profile $PR_{p,i}$ is a first predetermined number, e.g. 11-17. In the current image $I_c$ where the final contour CF of previous image $I_p$ is considered a provisional contour CF', a profile $PR_{c,i}$ is identified at each point i along contour CF'. Each profile $PR_{c,i}$ also comprises a line of sample points normal to contour CF' and extending equally in opposite directions from point i. However the number of sample points in each profile $PR_{c,i}$ is a second predetermined number about two to three times the first predetermined number, e.g. 25-35. Now with reference to FIG. 6C, each pair of corresponding profiles ($PR_{p,i}$ $PR_{c,i}$) is considered separately. In block 48 the profile $PR_{p,i}$ is displaced along profile $PR_{c,i}$ and for each displacement a correlation coefficient and a mean squared error between the intensities of registered sample points of the profiles are computed in blocks 50 and 52. In subtraction step 54, the mean squared error is subtracted from the correlation coefficient to form a match measure. Block 56 returns the displacement for which the match measure between the profile pair ($PR_{p,i}$ $PR_{c,i}$) is maximum. A point on profile $PR_{c,i}$ at that displacement from point i is taken as a point on noisy contour CN.

Figure 7:
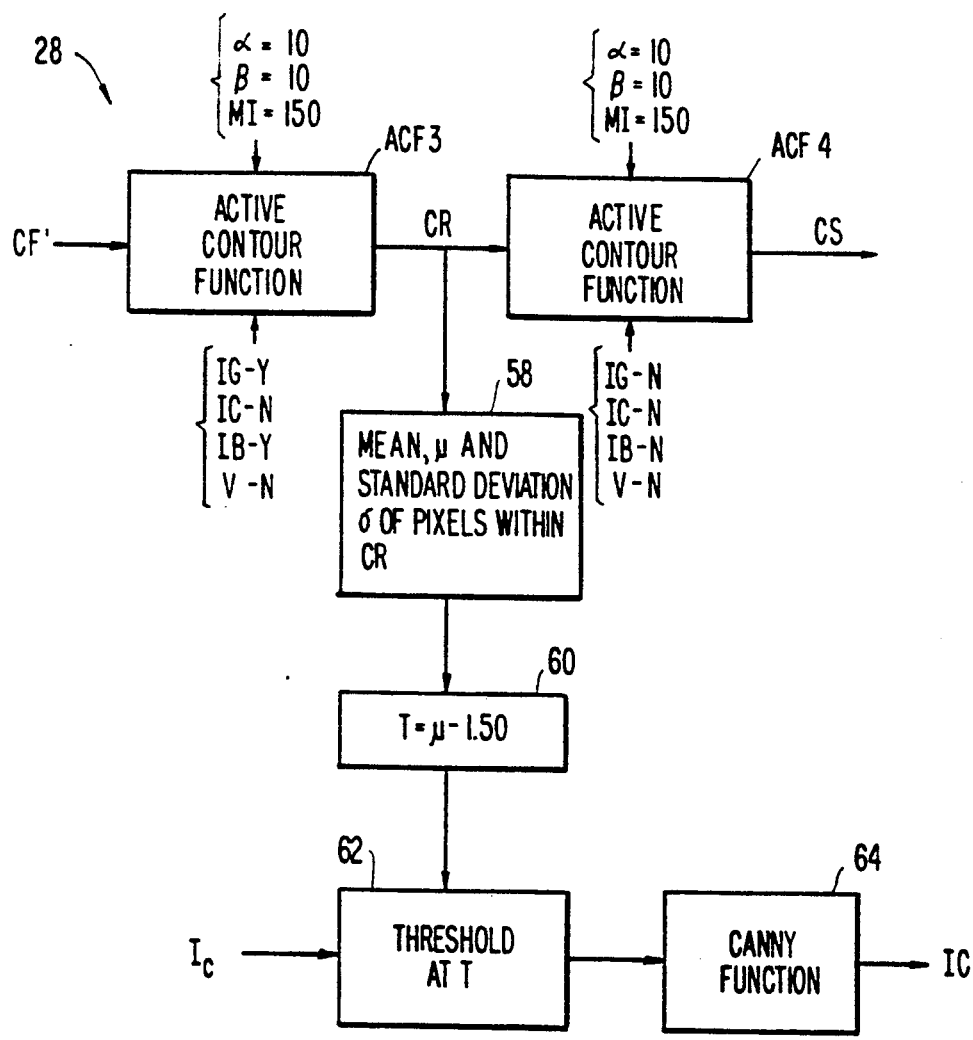
FIG. 7 is a flowchart detailing still another block in FIG. 2, namely an in-slice propagation of a final contour in a previous image to a seed contour in a current image which is of an adjoining phase.

FIG. 7 details the in-slice provisional-to-seed propagation function block 28. Therein, the provisional contour CF' is applied to a third active contour function block ACF3 where the stiffness is set to ten times normal ($\alpha=10$, $\beta=10$), a normal number of iterations is used (MI=150) and image gradient IG and image barrier IB (for apical slice(s) of a gradient-echo study) terms are turned on. The large $\alpha$ causes the provisional contour CF' to reduce or shrink in size to a reduced contour CR which is substantially entirely in the blood pool. Reduced contour CR is applied to block 58 where the mean $\beta$ and standard deviation $\sigma$ of the intensities of the pixels within reduced contour CR are determined. These quantities are applied to block 60 where a threshold $T=\mu-1.5\ \sigma$ is formed and the current image $I_c$ is thresholded in block 62, using that threshold T, to a binary image which is applied to "Canny Function" block 64 which is of the same form as block 44 in FIG. 4. The manner of computation of threshold T substantially assures that the output of "Canny Function" block 64 is the "Canny edge" energy function IC including an operative energy band at the blood pool inner heart wall interface.

Reduced contour CR is applied to a fourth active contour function block ACF4 in which the active contour remains at ten times normal stiffness ($\alpha=10$, $\beta=10$), at a normal maximum number of iterations (MI = 150) but with only the "Canny edge" constraint energy term IC turned on. Thus the fourth active contour function block ACF4 utilizes the "Canny edge" term IC developed by function block 64.

Reference is made to FIGS. 8A and 8B with respect to the post-processing block 30 used when the MRI data is from a gradient echo study. FIG. 8A illustrates a correctly located final contour CF along the inner side of heart wall H bounding blood pool B. FIG. 8B shows an incorrectly located final contour CF in which, because of relative thinness of heart wall H, final contour CF has lodged against the outer side of the heart wall. This may have occurred, for example, in a non-apical slice where a barrier IB is not used in the first active contour function ACF1 (seed-to-final propagation). The object of the post-processing is to identify such situations where final from the contour feature to be extracted and to encourage the active contour away from such region. This may be accomplished by applying the barrier energy term IB and also by placing a plurality of volcanos V outside the heart wall H. Accordingly, referring also to FIG. 8C, in block 68 it is automatically determined whether such correction is necessary (i.e. whether there any any points on the contour proximate the barrier) and when so, the final contour CF is applied to a fifth active contour function ACF5 followed by a sixth active contour function ACF6, such that there are first a maximum of 50 iterations (MI = 50) in the presence of image gradient and image barrier energy terms followed by a maximum of 100 iterations in the presence of image gradient IG and volcano V energy terms. A normal stiffness of the active contour ($\alpha=1$, $\beta=1$) is used in each of the fifth and sixth active contour blocks ACF5, ACF6.

With the aforedescribed methods, final contours CF have been automatically extracted with the only user contour feature identifying input being that of the seed contour for the initial image $I_{0,0}$. It should therefore be apparent that the objects of the present invention have been attained, and that numerous modifications, deletions to or additions in the details given of the preferred embodiments are possible within the intended spirit and scope of the present invention.

What is claimed is:

1. A method of extracting final contours fit to a contour feature in a collection of images obtained by scanning an object undergoing a repetitive motion cycle with magnetic resonance imaging apparatus, each of said images representing a different combination of a slice position, selected from a plurality of successively spatially displaced slice positions in the object, and a phase position, selected from a plurality of successive phase positions in the motion cycle, said method comprising:

displaying on a display device an initial image from said collection of images, corresponding to a combination of a predetermined first phase position and a predetermined first slice position;

receiving and displaying in said initial image a seed contour input by a user, via an input device, proximate a contour feature in said initial image, to be extracted;

automatically propagating said seed contour with a seed-to-final propagation function to produce a final contour which is fit to said contour feature in said initial image; said final contour being a provisional contour for a first pair of in-slice images at the first slice position and at phase positions which respectively immediately precede and immediately succeed said first phase position and for a first pair of in-phase images at the first phase position and at slice positions which respectively immediately precede and immediately succeed said first slice position;

automatically, without further action by the user, propagating said provisional contour for said first pair of in-slice images with an in-slice provisional-to-seed propagation function to respective seed contours for said first pair of in-slice images;

automatically, without further action by the user, propagating said provisional contour for said first pair of in-phase images with an in-phase provisional-to-seed propagation function to respective seed contours for said first pair of in-phase images; and automatically propagating said seed contours for said first pairs of in-phase and in-slice images with said seed-to-final propagation function to respective final contours fit to said contour feature in said first pairs of in-phase and in-slice images;

wherein said seed-to-final propagation function comprises applying a plurality of iterations of an energy minimizing active contour function having an energy which is a function of energy derived from the image at the active contour, active contour stretching energy, and active contour bending energy.

2. The method as claimed in claim 1, wherein said final contours in said first pair of in-phase images are provisional contours for a second pair of in-phase images at the first slice position and at phase positions which respectively immediately precede a phase position of one of the first pair of in-phase images and immediately succeed a phase position of the other of said first pair of in-phase images, and further comprising:

automatically, without further action by the user, propagating said provisional contours for said second pair of in-phase images with said in-phase provisional-to-seed propagation function to respective seed contours for said second pair of in-phase images; and automatically propagating said seed contours for second pair of in-phase images with said seed-to-final propagation function to respective final contours fit to said contour feature in said second pair of in-phase images.

3. The method as claimed in claim 2, wherein said final contours in said first pair of in-slice images are provisional contours for a second pair of in-slice images at the first phase position and at slice positions which respectively immediately precede a slice position of one of the first pair of in-slice images and immediately succeed a slice position of the other of said first pair of in-slice images, and further comprising:

automatically, without further action by the user, propagating said provisional contours for said second pair of in-slice images which said in-slice provisional-to-seed propagation function to respective seed contours for said second pair of in-slice images; and automatically propagating said seed contours for second pair of in-slice images with said seed-to-final propagation function to respective final contours fit to said contour feature in said second pair of in-slice images.

4. The method as claimed in claim 2, wherein the final contour in one of said first pair of in-phase images is a provisional contour for a second pair of in-slice images at the same slice position as said one of said first pair of in-phase images and at phase positions which respectively immediately precede and immediately succeed said first phase position and the final contour in the other of said first pair of in-phase images as a provisional contour for a third pair of in-slice images at the same slice position as said other of said first pair of in-phase images and at phase positions which respectively immediately precede and immediately succeed said first phase position, and further comprising:
- automatically, without further action by the user, propagating said provisional contours for said second and third pairs of in-slice images with said in-slice provisional-to-seed propagation function to respective seed contours for said second and third pairs of in-slice images; and
- automatically propagating said seed contours for second and third pairs of in-slice images with seed-to-final propagation function to respective final contours fit to said contour feature in said second and third pairs of in-slice images.

5. The method as claimed in claim 3, wherein the final contour in one of said first pair of in-phase images is a provisional contour for a third pair of in-slice images at the same slice position as said one of said first pair of in-phase images and at phase positions which respectively immediately precede and immediately succeed said first phase position and the final contour in the other of said first pair of in-phase images is a provisional contour for a fourth pair of in-slice images at the same slice position as said other of said first pair of in-phase images and at phase positions which respectively immediately precede and immediately succeed said first phase position, and further comprising:
- automatically, without further action by the user, propagating said provisional contours for said third and fourth pairs of in-slice images with said in-slice provisional-to-seed propagation function to respective seed contours for said third and fourth pairs of in-slice images; and
- automatically propagating said seed contours for third and fourth pairs of in-slice images with said seed-to-final propagation function to respective final contours fit to said contour feature in said third and fourth pairs of in-slice images.

6. The method as claimed in claim 1, wherein said final contours in said first pair of in-slice images are provisional contours for a second pair of in-slice images at the first phase position and at slice positions which respectively immediately precede a slice position of one of the first pair of in-slice images and immediately succeed a
- automatically, without further action by the user, propagating said provisional contours for said second pair of in-slice images with said in-slice provisional-to-seed propagation function to respective seed contours for said second pair of in-slice images; and
- automatically propagating said seed contours for second pair of in-slice images with said seed-to-final propagation function to respective final contours fit to said contour feature in said second pair of in-slice images.

7. The method as claimed in claim 6, wherein the final contour in one of said first pair of in-phase images is a provisional contour for a third pair of in-slice images at the same slice position as said one of said first pair of in-phase images and at phase positions which respectively immediately precede and immediately succeed said first phase position and the final contour in the other of said first pair of in-phase images is a provisional contour for a fourth pair of in-slice images at the same slice position as said other of said first pair of in-phase images and at phase positions which respectively immediately precede and immediately succeed said first phase position, and further comprising:
- automatically, without further action by the user, propagating said provisional contours for said third and fourth pairs of in-slice images with said in-slice provisional-to-seed propagation function to respective seed contours for said third and fourth pairs of in-slice images; and
- automatically propagating said seed contours for third and fourth pairs of in-slice images with said seed-to-final propagation function to respective final contours fit to said contour feature in said third and fourth pairs of in-slice images.

8. The method as claimed in claim 1, wherein the final contour in one of said first pair of in-phase images is a provisional contour for a second pair of in-slice images at the same slice position as said one of said first pair of in-phase images and at phase positions which respectively immediately precede and immediately succeed said first phase position and the final contour in the other of said first pair of in-phase images is a provisional contour for a third pair of in-slice images at the same slice position as said other of said first pair of in-phase images and at phase positions which respectively immediately precede and immediately succeed said first phase position, and further comprising:
- automatically, without further action by the user, propagating said provisional contours for said second and third pairs of in-slice images with said in-slice provisional-to-seed propagation function to respective seed contours for said second and third pairs of in-slice images; and
- automatically propagating said seed contours for second and third pairs of in-slice images with said seed-to-final propagation function to respective final contours fit to said contour feature in said second and third pairs of in-slice images.

9. The method as claimed in claim 1, wherein said in-phase provisions-to-seed propagation function comprises forming rough contours by matching intensity profiles in said initial image along normals to and proximate to said final contour in said initial image to intensity profiles in said first pair of in-phase images along said normals and proximate to said rough contours in said first pair of images, and applying a spatial smoothing function to said rough contours.

10. The method as claimed in claim 1, wherein said in-slice provisional-to-seed propagation function comprises thresholding said first pair of in-slice images to form for each, an in-slice thresholded image, determining extended edges in the respective in-slide thresholded images, and applying said energy minimizing active contour function with an energy derived from said extended edges.

11. The method as claimed in claim 9, wherein said in-slice provisional-to-seed propagation function comprises thresholding said first pair of in-slice images to form for each, an in-slice thresholded image, determining extended edges in the respective in-slice thresholded images, and applying said energy minimizing active contour function with an energy derived from said extended edges.

12. The method as claimed in claim 9, wherein said spatial smoothing function comprises applying said active contour function to said rough contours in the absence of energy derived from the image but with a predetermined limited number of iterations.

13. The method as claimed in claim 10, wherein said spatial smoothing function comprises applying said active contour function to said rough contours in the absence of energy derived from the image but with a predetermined limited number of iterations.

14. The method as claimed in claim 11, wherein said spatial smoothing function comprises applying said active contour function to said rough contours in the absence of energy derived from the image but with a predetermined limited number of iterations.

15. A method of determining a relative volume of a blood pool in a heart chamber of a patient at a pair of generally opposed phase positions in a beating cycle, comprising:

scanning a chest region of the patient with magnetic resonance imaging apparatus to obtain a collection of images of slices through the patient's heart chamber, each of said images representing a different combination of a slice position, selected from a plurality of successively spatially displaced slice positions in the heart chamber, and a phase position, selected from a plurality of successive phase positions in the beating cycle;

displaying on a display device an initial image from said collection of images, corresponding to a combination of a predetermined one of said phase positions and a slice position at a middle one of said slice positions;

receiving and displaying in said initial image a seed contour input by a user, via an input device, proximate an inner wall of said chamber defining said blood pool in said initial image;

using said seed contour as the only user input contour proximate the inner wall of said chamber, successively extracting final contours defining said blood pool in said respective images by automatically, without further action by the user, propagating successive extracted final contours from respective images to seed contours for images which adjoin the respective images in slice or phase position, and automatically, without further action by the user, propagating said seed contours to final contours using a seed-to-final propagation function; and using said extracted final contours for images in the first and second phase positions, computing said relative volume;

wherein said seed-to-final propagation function comprises applying a plurality of iterations of an energy minimizing active contour function having an energy which is a function of energy derived from the image at the active contour, active contour stretching energy, and active contour bending energy.

16. A method of obtaining final contours fit to a contour feature of an object undergoing a repetitive motion cycle, said method comprising:

scanning the object with magnetic resonance imaging apparatus to obtain a collection of images of the object, each of said images representing a different combination of a slice position, selected from a plurality of successively spatially displaced slice positions in the object, and a phase position, selected from a plurality of successive phase positions in the motion cycle;

displaying on a display device an initial image from said collection of images, corresponding to a combination of a predetermined first phase position and a predetermined first slice position;

receiving and displaying in said initial image a seed contour input by a user, via an input device, proximate a contour feature in said initial image, to be extracted;

automatically propagating said seed contour with a seed-to-final propagation function to produce a final contour which is fit to said contour feature in said initial image; said final contour being a provisional contour for a first pair of in-slice images at the first slice position and at phase positions which respectively immediately precede and immediately succeed said first phase position and for a first pair of in-phase images at the first phase position and at slice positions which respectively immediately precede and immediately succeed said first slice position;

automatically, without further action by the user, propagating said provisional contour for said first pair of in-slice images with an in-slice provisional-to-seed propagation function to respective seed contours for said first pair of in-slice images;

automatically, without further action by the user, propagating said provisional contour for said first pair of in-phase images with an in-phase provisions-to-seed propagation function to respective seed contours for said first pair of in-phase images; and automatically propagating said seed contours for said first pairs of in-phase and in-slice images with said seed-to-final propagation function to respective final contours fit to said contour feature in said first pairs of in-phase and in-slice images;

wherein said seed-to-final propagation function comprises applying a plurality of iterations of an energy minimizing active contour function having an energy which is a function of energy derived from the image at the active contour, active contour stretching energy, and active contour bending energy.

* * * * *